Jan. 3, 1956 H. F. RIETH 2,729,747

ULTRA HIGH FREQUENCY TUNING APPARATUS

Filed Feb. 19, 1951 3 Sheets-Sheet 1

Inventor
Harold F. Rieth
by Hill, Sherman, Meroni, Gross & Simpson Attys

Jan. 3, 1956 H. F. RIETH 2,729,747

ULTRA HIGH FREQUENCY TUNING APPARATUS

Filed Feb. 19, 1951 3 Sheets-Sheet 2

Inventor
Harold F. Rieth
by Hill, Sherman, Meroni, Gross & Simpson
Attys

Jan. 3, 1956 H. F. RIETH 2,729,747

ULTRA HIGH FREQUENCY TUNING APPARATUS

Filed Feb. 19, 1951 3 Sheets-Sheet 3

Inventor
Harold F. Rieth
by ... Attys

United States Patent Office 2,729,747

Patented Jan. 3, 1956

2,729,747

ULTRA HIGH FREQUENCY TUNING APPARATUS

Harold F. Rieth, Kokomo, Ind., assignor to Kingston Products Corporation, Kokomo, Ind., a corporation of Indiana Application February 19, 1951, Serial No. 211,633

7 Claims. (Cl. 250—40)

This invention relates generally to ultra high frequency tuning apparatus and more particularly to a television tuner.

The subject matter of this application constitutes a continuation-in-part of the disclosure contained in my copending application, Serial No. 94,103, filed May 19, 1949, now Patent 2,557,234, issued June 19, 1951.

In my acknowledged copending application, Serial No. 94,103, filed May 19, 1949, a tuning apparatus was disclosed which is characterized by a physical arrangement of tuning circuit components whereby a simple rotary mechanical movement combines several tuning functions into a single switching action.

In the present disclosure, a substantially similar physical arrangement is advantageously exploited in a convertor-type tuning apparatus which is capable of developing a frequency selection function throughout a much wider range than has been conventionally obtainable by V. H. F. receivers heretofore provided.

According to the general principles of the present invention, a frequency selective tuning apparatus is provided including resonating circuit means having a curved parallel line adapted to concentrically surround a tuning circuit means in circuit relationship therewith and arranged on a predisposed plane within a shield or casing. A slider bar engageable with the parallel line is used to selectively control the resonating circuit means and is supported for angular adjustment by means of a ring-like support member mounted for rotation around the parallel line. A driving means is provided to angularly adjust the position of the slider bar, thereby to effect selective frequency selection and adjustable indexing means are provided to lock the support member and the slider bar in angularly adjusted position.

It is an object of the present invention, therefore, to provide an ultra high frequency tuning apparatus capable of covering a frequency range of wider scope than has been heretofore possible.

Another object of the present invention is to provide a simple and inexpensive tuning apparatus made up of a reduced number of conveniently fabricated structural components.

Yet another object of the present invention is to provide a convertor-type tuning apparatus in which tracking is facilitated and in which uniform tuning may be effected by a simple mechanical movement.

Yet another object of the present invention is to provide a tuning apparatus in which the circuit components are adequately shielded from one another.

Many other features, advantages and additional objects of the present invention will become manifest to those versed in the art upon making reference to the detailed description which follows and the accompanying sheets of drawings, in which a preferred form of a tuning apparatus provided in accordance with the principles of the present invention is set forth.

Figure 1:
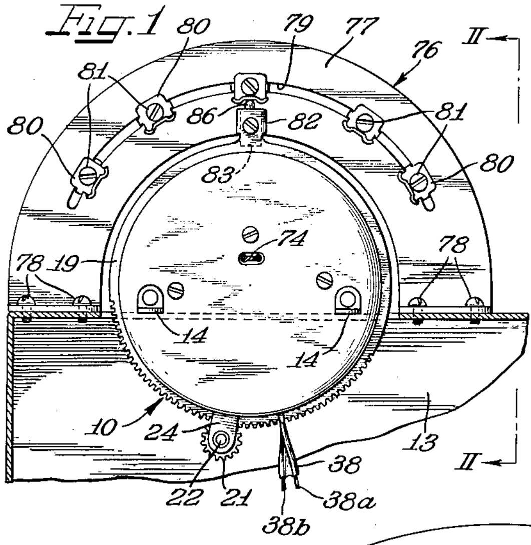
Figure 1 is an elevational view of a tuning apparatus provided in accordance with the principles of the present invention showing in fragmentary cross section the mounting arrangement of the tuning apparatus in a typical chassis of a television receiving set.

The tuning apparatus of the present invention is indicated generally by reference numeral 10 and is shown as comprising a first cover 11 and a second cover 12 together forming a unitary casing in which the components of the tuning apparatus 10 may be housed.

By way of illustrative example, the tuning apparatus 10 is shown mounted in the chassis 13 of a typical television receiver set by means of appropriate clip brackets 14 which may be connected to both of the covers 11 and 12 in order to support the tuning apparatus 10 in firm assembly with the chassis 13.

Between the covers 11 and 12 are situated the electrical components of the tuning apparatus 10. A support member 16 is provided which preferably takes the form of a flat disk of metal upon which may be mounted a tuning circuit means including the necessary radio tubes and associated circuit components common to most ultra high frequency receiving apparatus.

Surrounding the support member 16 is an annular ring 17 which circles the support member 16. In order to mount the ring 17 for relative rotational movement with respect to the support member 16, a plurality of bracket supports 18 provide a sliding trackway for the ring 17.

The peripheral portion of the ring 17 indicated by the reference numeral 19 extends outwardly of the covers 11 and 12 and a portion of the peripheral portion 19 is provided with gear teeth as at 20 for engaging and meshing with a driver gear 21 mounted for rotation on a shaft 22 extending exteriorly of the chassis 13 and actuatable by a knurled dial knob 23. The shaft is preferably supported for rotation by appropriate bearing supports 24 carried in firm assembly with the support member 16 and by a bearing support member 26 connected to the cover 12.

On the side of the support member 16 enclosed by the cover 11, a shield 27 extends upwardly and is provided with a segmental tubular center portion **27*a* which is generally concentrically aligned relative to a center line axis normal to the support member 16. A plurality of bent over tabs 28 each having a threaded aperture 29 therein are provided on the shield 27 to receive fastening screws 30 which serve to hold the cover 11 in firm assembly with the support member 16**.

It may be noted that the shield 27 is bent to form an obtuse angle and the segmental tubular portion **27*a* also includes slightly more than 180° of arc. The end portions of the shield 27 extend beyond the support member 16 and into the path of rotation of the ring 17 thereby to engage a stop member 31 fastened to the ring 17 by a pair of fasteners 32. It may be noted that the toothed portion of the ring 17 indicated at 20 may be coextensive with the included angle between the end portions of the shield 27, or nearly so, thereby to coincide with the limit of relative angular movement between the ring 17 and the support member 16**.

On the opposite side of the support member 16 a substantially circular upstanding shield 33 is provided having a first partition leg 33*a* and a second partition leg 33*b* extending radially outwardly from the ends thereof in spaced apart relation to one another. A plurality of tabs 34 are provided on the shield 33, each of the tabs having a threaded aperture 36 to receive a screw 37 and serving to hold the cover 12 in firm assembly with the support member 16.

Having thus described the environment established by the housing components of the tuning apparatus 10, the advantageous circuit features of the present invention will be described.

On the side of the support member 16 enclosed by the cover 12, a preselector circuit is provided. An antenna wire 38 having twin leads 38*a* and 38*b* is led into the housing and is connected to a coupling coil 39. The coupling coil 39 preferably takes the form of a single length of wire bent back upon itself to form a loop, one leg of the coupling coil 39 being connected to the antenna lead 38*a* and the other leg being connected to the antenna lead 38*b*. The looped portion of the coupling coil 39 is formed into an arcuate configuration and is firmly retained by a pair of spaced insulator blocks 40 and 41, respectively in generally eccentric radial alignment relative to the axis of the support member 16. The insulators 40 and 41 may be mounted in firm assembly with the shield 33 by means of nut and bolt type fasteners 42.

Figure 8:
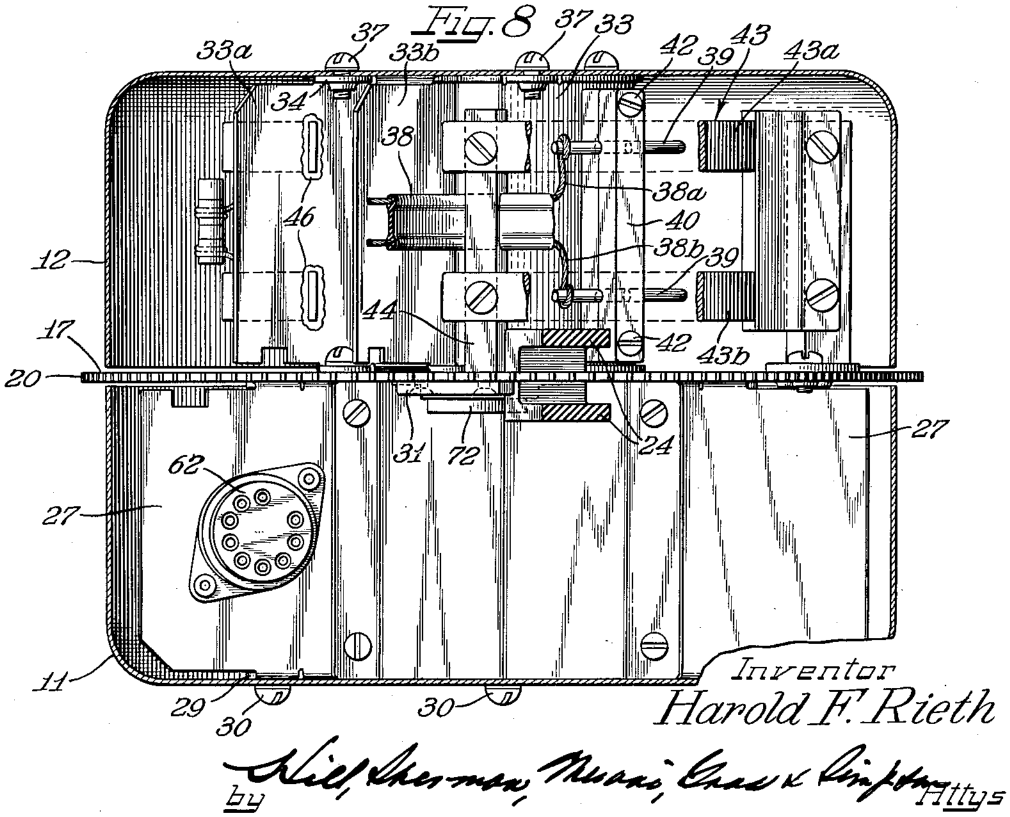
Figure 8 is a cross sectional view with parts broken away and with parts removed, partly in elevation, taken substantially on line VIII—VIII of Figure 4.

The coupling coil 39 is inductively coupled to a tunable preselector parallel line indicated generally by the reference numeral 43. The preselector parallel line 43 preferably takes the form of two parallel strips of silver plated brass thereby constituting a parallel line including a first leg 43*a* and a second leg 43*b*. One end of each of the legs 43*a* and 43*b* is connected to an electrically non-conductive insulator 44 connected to the support member 16, the other end of each of the legs 43*a* and 43*b* being firmly connected to the partition leg 33*a* of the shield 33 as at 46 (Figure 8). The tunable preselector parallel line 43 is preferably formed in an arcuate configuration which facilitates alignment in concentric position relative to the axis of the support member 16. Thus, the radial spacing dimension between the coupling coil 39 and the parallel line 43 will vary proportionally between opposite ends of the coupling coil 39 to make the inductive coupling uniform over the entire band range.

The electrical length of the parallel line may be selectively adjusted throughout an extensive frequency range by angularly positioning a slider bar device 47 carried by the ring 17. The slider bar device 47 includes a body member 48 made of electrically non-conductive material which is secured in firm assembly with a mounting plate 49 having a pair of spaced slots 50 therein to facilitate adjustable assembly thereof to the ring 17 by means of screw pins 51 engageable with the ring 17 and arranged to accommodate angular adjustment of the mounting plate 49.

A slider plate 52 preferably made out of a flexible spring metal is secured to the body 48 by a plurality of fasteners 53 and is suitably shaped to provide a substantial contact surface to slidably engage the parallel line 43. The slider plate 52 is preferably silver plated to promote the electrical efficiency thereof.

To further promote efficient electrical contact between the slider plate and the parallel line 43, a recess 52*a* is provided in the plate 52 to seat spring retainers 54 each seating one end of a coil spring 56 bottomed in an appropriate spring recess formed in the body 48 of the slider device 47.

It will be apparent that tuning of the parallel line 43 not only embraces a larger frequency range than has been heretofore possible but may be effected simply and uniformly by positioning the slider device 47 along the length of the parallel line 43 in accordance with a continuous tuning relationship which greatly facilitates tracking. Thus, the tuning apparatus 10 permits a high tuning efficiency to be obtained concurrently with the enjoyment of wide structural tolerances which reduce production costs and afford design flexibility.

The components of the oscillator circuit are located on that portion of the support element 16 enclosed by the cover 11. A second parallel line 57 including a pair of spaced legs 57*a* and 57*b* respectively is curved into an arcuate configuration so as to facilitate alignment thereof concentrically to the axis passing through the support member 16. One end of each of the legs 57*a* and 57*b* is connected by means of screws 58 to a block 59 of electrically non-conductive material fastened to the support member 16 by a pair of fasteners 60. The other end of each of the legs 57*a* and 57*b* is electrically connected as at 61 to a socket 62 for an electron tube associated with the oscillator circuit.

In order to selectively tune the parallel line 57 to change the effective electrical length thereof, a slider bar device 63 is provided including a body 64 secured to the ring 17 by appropriate fasteners 66 engageable with a set of aligned spaced apart threaded apertures 67 formed in the ring 17 and a slider plate 68 of flexible metal is fastened to the body 64 by a pair of screws 69, the slider plate 68 being bent to provide a flat engaging surface to slidably contact both legs of the parallel line 57.

In order to promote efficient electrical contact between the slider plate 68 and the legs of the parallel line 67, the slider plate 68 may be preferably made of a flexible metal which is silver coated and a plurality of spring retainers 70 may also be provided, each seating a spring 71 bottomed in a spring recess formed in the body 64, the spring retainer 70 being seated, in turn, in a recess 68*a* formed in the slider plate 68.

Figure 3:
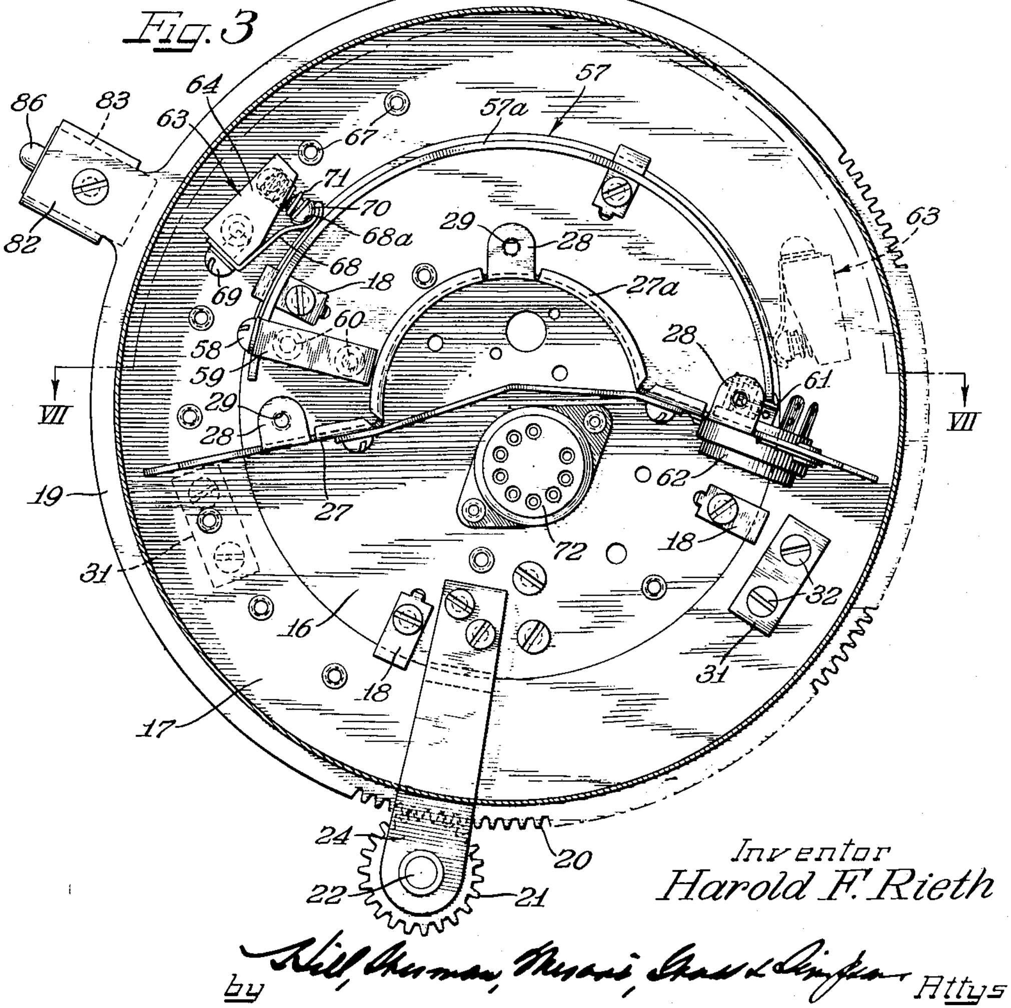
Figure 3 is an enlarged cross sectional view with parts removed and with parts broken away taken on line III—III of Figure 2.
Figures 4, 5, 6:
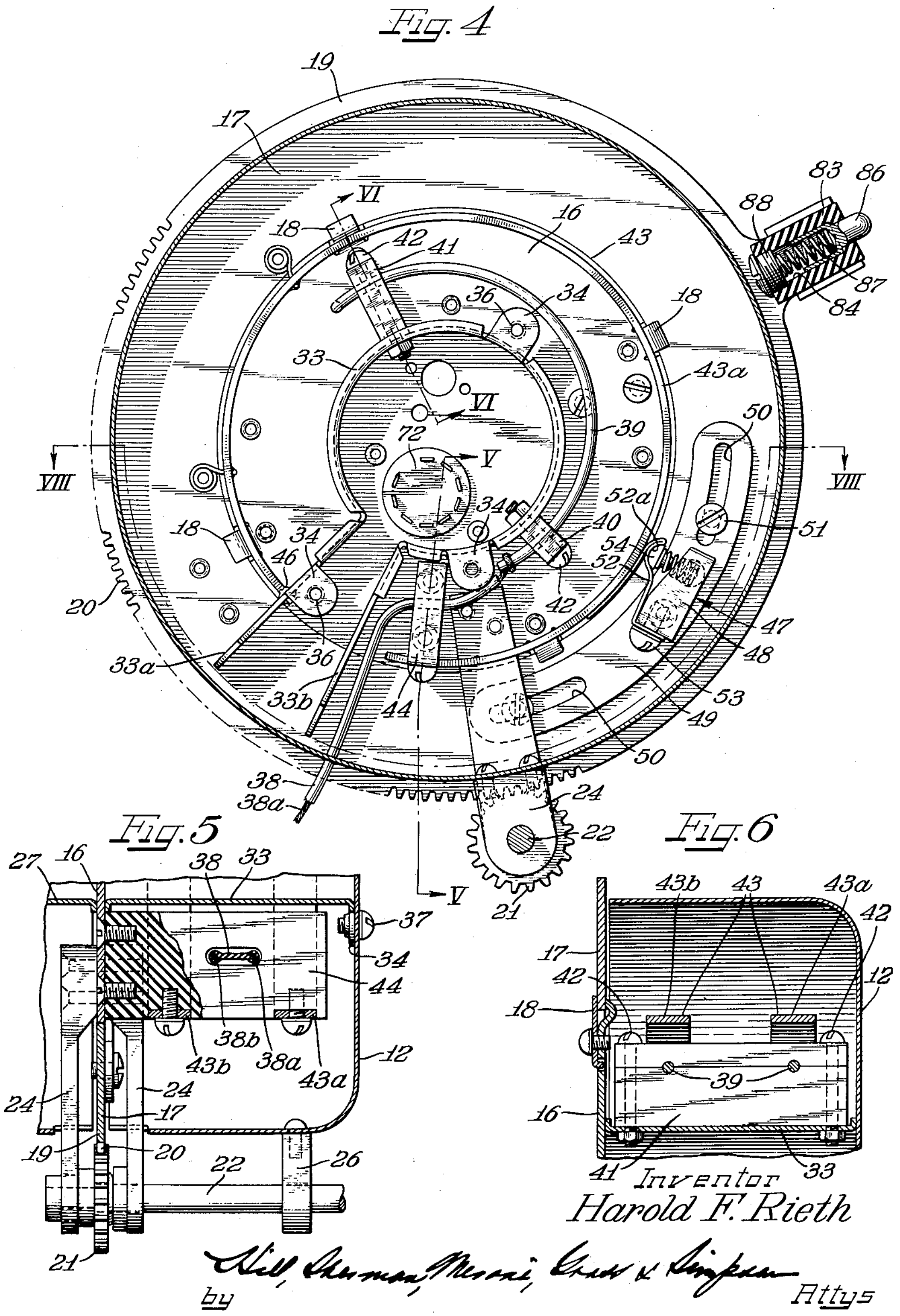
Figure 4 is an enlarged cross sectional view with parts removed and with parts broken away taken on line IV—IV of Figure 2.
Figure 5 is a fragmentary cross sectional view with parts shown in elevation and with parts broken away to illustrate additional details of construction taken substantially on line V—V of Figure 4.
Figure 6 is a fragmentary cross sectional view with parts shown in elevation taken substantially on line VI—VI of Figure 4.
Figure 7:
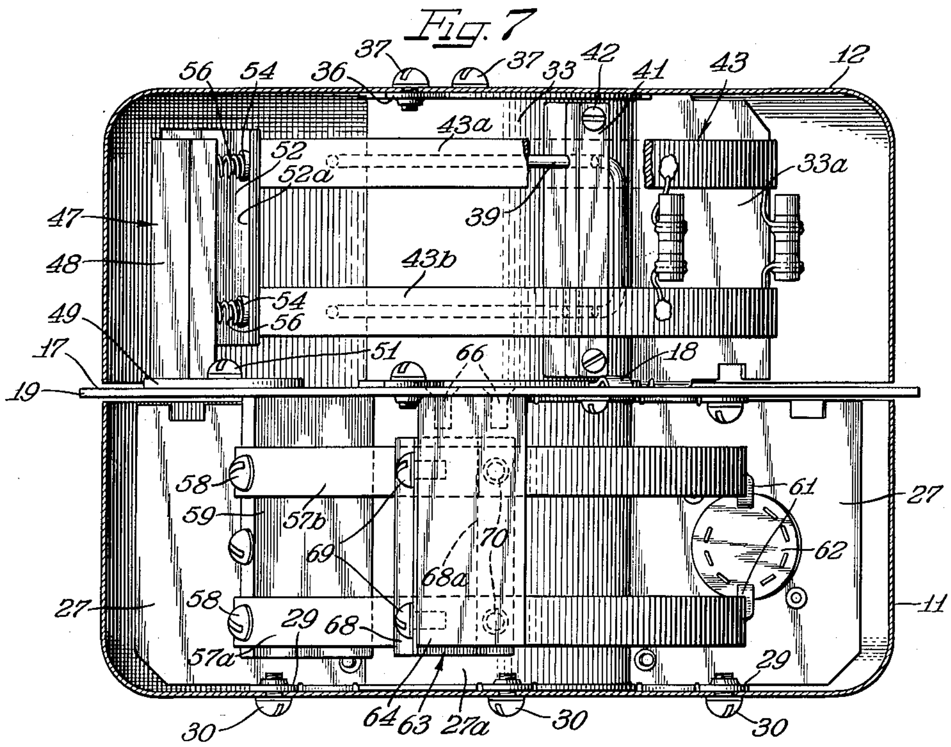
Figure 7 is a cross sectional view with parts broken away for the sake of clarity and with parts removed taken substantially on line VII—VII of Figure 3.

As is indicated in Figure 3, the slider bar device 63 is rotatably movable from the full line position to the dotted line position, in other words, within the limits prescribed by the cooperation of the ends of the partition 27 and the stop member 31.

By arranging the slider bar device 47 of the preselector circuit and the slider bar device 63 of the oscillator circuit on opposite sides of the ring 17, the slider devices are effectively gaged for concurrent adjustment of the preselector circuit and oscillator circuit. Thus, the output frequency of the tuner may be kept constant for all values of single radio frequency since the preselector circuit will select a predetermined single frequency and the oscillator circuit will be concurrently tuned to a proper correlating frequency.

Figure 2:
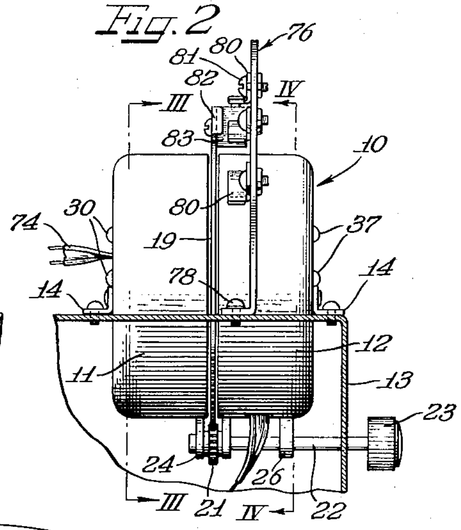
Figure 2 is a cross sectional view with parts added and with parts shown in elevation taken substantially on line II—II of Figure 1.

Although a socket 72 for an electron tube is shown on the support member 16, the various components of the output circuit of the mixer stage are not shown since the various circuit components are well known to those versed in the art and can be arranged in any convenient manner adjacent the shields 27 and 33. It may be noted that the output signal is carried to the video amplifier of the receiving set via the conductor 74 shown in Figures 1 and 2.

In order to retain a channel or station selection on the tuning apparatus 10, any suitable indexing mechanism may be provided, however, in the preferred embodiment herein shown an adjustable indexing mechanism indicated generally by the reference numeral 76 is advantageously exploited. A detent frame 77 is fastened to the chassis 13 by a plurality of screws 78 and is provided with an arcuate slot 79 concentrically aligned relative to the ring 17. A plurality of adjustable detents 80 are positionable along the length of the slot 79 and may be locked in selected angular position by means of appropriate locking screws 81. A boss 82 is provided on the peripheral portion 19 of the ring 17 and retains in firm assembly therewith a housing 83 having a hollow bore 84 to receive a detent pin 86 normally spring urged by a coil spring 87 bottomed against a retainer plug 88 threaded in the bore of the housing 83.

Although various minor structural modifications might be suggested by those versed in the art to the preferred structural embodiment herein described in considerable detail for the sake of clarity only, it should be understood that I wish to embody within the scope of the patent all such modifications as reasonably and properly come within the scope of my contribution to the art.

I claim as my invention:

1. In a frequency selective tuning apparatus, a flat support member, circuit means including at least one parallel line resonating circuit loop on each side of said support member, an annulus circling the support member and rotatably mounted for angular adjustment relative thereto, and oppositely extending ganged slider bars engageable with each of said lines to control said resonating circuit loops in response to rotation of said support member for effecting selective frequency selection.

2. In a frequency selective tuning apparatus as defined in claim 1, control means to angularly adjust said annulus.

3. In a frequency selective tuning apparatus as defined in claim 2, indexing means to lock said annulus in angularly adjusted positions.

4. In a frequency selective tuning apparatus as defined in claim 3, said indexing means being angularly adjustable to lock said annulus in selected angularly adjusted positions.

5. In a frequency selective tuning apparatus, a support member, tuning circuit means on said support member including a coupling coil on one side of said support member and adapted to be connected to an antenna, said coupling coil being formed in an arcuate configuration, said coupling coil being arranged in eccentric alignment relative to an axis normal to said support member, a circuit means on said support member including resonating circuit means having a first parallel line formed in an arcuate configuration and arranged in concentric alignment relative to said axis, said first line and said coupling coil being inductively coupled, said resonating circuit means further including an oscillating circuit having a second parallel line formed in an arcuate configuration and arranged in concentric alignment to said axis on the other side of said support member, an annulus circling said support member and together therewith forming a shield between the components of said circuit means, ganged slider bars on said annulus engageable with said first and second lines, and means to rotatably adjust said annulus relative to said support member for effecting frequency selection.

6. In a frequency selective tuning apparatus, a support member having a generally tubular shield connected thereto, the bore of said shield arranged in concentric alignment to an axis normal to said support member, tuning circuit means on said support member including a coupling coil formed in an arcuate configuration and spaced radially outwardly of said shield, resonating circuit means on said support member including a parallel line formed in an arcuate configuration and spaced outwardly of said coupling coil, said coupling coil being eccentrically offset relative to said axis and said line being radially aligned relative thereto, whereby said coupling coil and said parallel line are uniformly coupled inductively.

7. In a frequency selective tuning apparatus, a flat support member, an annulus substantially circling said support member, means mounting said annulus and said support member for relative movement, tuning circuit means on opposite sides of said support element including resonating circuit means having frequency adjustment control elements carried by said annulus, said support member and said annulus being made of electrically conductive materials and lying in coplanar relation concentrically adjacent one another to form a substantially unbroken baffle shielding the oppositely disposed tuning circuit means from one another.

References Cited in the file of this patent

UNITED STATES PATENTS

| | | |
|---|---|---|
| 1,394,555 | Ide | Oct. 25, 1921 |
| 1,816,718 | Bond | July 28, 1931 |
| 1,834,272 | Enderwood | Dec. 1, 1931 |
| 2,113,758 | De Vries et al. | Apr. 12, 1938 |
| 2,126,541 | De Forest | Aug. 9, 1938 |
| 2,246,928 | Schick | June 24, 1941 |
| 2,292,254 | Van Beuren | Aug. 4, 1942 |
| 2,367,639 | Segerstrom | Jan. 23, 1945 |
| 2,379,284 | Dimmer | June 26, 1945 |
| 2,404,399 | Pickles | July 23, 1946 |
| 2,436,114 | Maxson | Feb. 17, 1948 |
| 2,557,234 | Rieth | June 19, 1951 |

FOREIGN PATENTS

| | | |
|---|---|---|
| 906,770 | France | Jan. 18, 1946 |